US012562712B2

(12) United States Patent
Smirnow et al.

(10) Patent No.: US 12,562,712 B2
(45) Date of Patent: Feb. 24, 2026

(54) ULTRA-HIGH FREQUENCY MICRO-ACOUSTIC DEVICE

(71) Applicant: RF360 SINGAPORE PTE. LTD., Republic Plaza (SG)

(72) Inventors: Michael Smirnow, Munich (DE); Werner Ruile, Munich (DE); Matthias Knapp, Munich (DE)

(73) Assignee: RF360 Singapore Pte. Ltd., Singapore (SG)

( * ) Notice: Subject to any disclaimer, the term of this patent is extended or adjusted under 35 U.S.C. 154(b) by 1075 days.

(21) Appl. No.: 17/628,206

(22) PCT Filed: Aug. 5, 2020

(86) PCT No.: PCT/EP2020/071957
§ 371 (c)(1),
(2) Date: Jan. 18, 2022

(87) PCT Pub. No.: WO2021/028281
PCT Pub. Date: Feb. 18, 2021

(65) Prior Publication Data
US 2022/0255528 A1    Aug. 11, 2022

(30) Foreign Application Priority Data
Aug. 13, 2019    (DE) ..................... 10 2019 121 804.7

(51) Int. Cl.
*H03H 9/02*    (2006.01)
*H03H 9/25*    (2006.01)

(52) U.S. Cl.
CPC .... *H03H 9/02866* (2013.01); *H03H 9/02834* (2013.01); *H03H 9/02913* (2013.01); *H03H 9/25* (2013.01)

(58) Field of Classification Search
CPC .......... H03H 9/02866; H03H 9/02834; H03H 9/02913; H03H 9/25

USPC ...... 310/313 R, 313 A, 313 B, 313 C, 313 D
See application file for complete search history.

(56) References Cited

U.S. PATENT DOCUMENTS

| | | | | |
|---|---|---|---|---|
| 6,466,105 | B1 * | 10/2002 | Lobl | H03H 9/175 |
| | | | | 333/191 |
| 2006/0043507 | A1 | 3/2006 | Lobl et al. | |
| 2014/0097914 | A1 | 4/2014 | Lobl et al. | |
| 2015/0287905 | A1 | 10/2015 | Umeda et al. | |
| 2016/0020749 | A1 | 1/2016 | Henn et al. | |

(Continued)

FOREIGN PATENT DOCUMENTS

| | | |
|---|---|---|
| CN | 106209007 A | 12/2016 |

OTHER PUBLICATIONS

International Search Report and Written Opinion—PCT/EP2020/071957—ISA/EPO—ISA/EPO—Nov. 2, 2020.

(Continued)

*Primary Examiner* — Derek J Rosenau
(74) *Attorney, Agent, or Firm* — Polsinelli

(57) ABSTRACT

A micro-acoustic wave device is proposed for application in ultrahigh frequency range. The device uses a thin film piezoelectric material stacked on a carrier substrate. Additionally, a material is embedded between carrier substrate and piezoelectric thin film that decouples the acoustic of these layers. With this approach it is possible to achieve very high Q factor even for longitudinal waves, which are required for high frequency applications.

9 Claims, 3 Drawing Sheets

(56)                    References Cited

U.S. PATENT DOCUMENTS

2019/0379348  A1 *   12/2019   Tang ....................... H03F 3/245
2020/0083859  A1       3/2020   Watanabe et al.

OTHER PUBLICATIONS

Kimura T., et al., "Comparative Study of Acoustic Wave Devices Using Thin Piezoelectric Plates in the 3-5-GHz Range", IEEE Transactions on Microwave Theory and Techniques, Plenum, USA, vol. 67, No. 3, Mar. 1, 2019 (Mar. 1, 2019), pp. 915-921, XP011712916, ISSN: 0018-9480, DOI: 10.1109/TMTT.2018.2890661 [retrieved on Mar. 5, 2019] Section II, Figures 1, 2, 9.
Yang Y., et al., "Civil Engineering Materials", Basic properties of civil engineering materials, Jul. 31, 2018, 7 Pages.

* cited by examiner

ULTRA-HIGH FREQUENCY
MICRO-ACOUSTIC DEVICE

The invention refers to a micro-acoustic device realized as a stack on a carrier substrate and based on a thin piezoelectric film. The device may be embodied as a SAW resonator.

The evolution of next-generation mobile communication systems requires devices with outstanding combination of various performance criteria, e.g. high frequency, high quality factor, large electromechanical coupling (k2) and low temperature coefficient of frequency (TCF). Currently, typically used SAW devices based on lithium tantalate ($LiTaO_3$), lithium niobate ($LiNbO_3$) or quartz bulk substrates are widely used in low and mid band LTE applications, e.g. the range of 1 GHz up to 2.5 GHz. However, future applications like 5G require devices of up to 6 GHz which cannot be supported by those conventional SAW devices, so far.

First attempts in this frequency range with SAW resonators are based on sandwiched stacks, where a piezoelectric thin film is stacked on a carrier substrate in order to achieve high coupling. Optionally, a couple of dielectric materials can be added in between carrier substrate and piezoelectric thin film. Their purpose is to optimize certain criteria, e.g. low temperature coefficient of frequency. 5G frequency bands require the usage of wave types with outstandingly high velocity, e.g. longitudinal surface acoustic waves. However, these waves are not bounded to the surface and therefore tend to leak their wave energy to the substrate. Thus, first applications at high frequency range show poor quality factor.

It is an object of the present invention to provide a micro-acoustic device with an improved quality factor and a reduced coupling of wave energy into a bulk substrate that can be used for a frequency range up to 6 GHz.

This and other objects are met by a device according to claim 1. Specific further features of the new device as well as advantageous embodiments can be taken from the dependent claims.

The device is based on a stacked material system, which includes a high coupling piezoelectric thin film. The piezoelectric thin film comprises e.g. $LiTaO_3$ or $LiNbO_3$ with varying cut angles. The cut angle is chosen, that the main mode is a longitudinal wave due to its high sound velocity. Other modes are suppressed by design modifications and a suitable cut-angle selection.

The stack is formed on a carrier substrate. The piezoelectric thin film allows exciting a longitudinal wave as main mode. Longitudinal waves are preferred due to their high sound velocity when compared to Raleigh waves or shear waves. The coupling of wave energy into the bulk carrier is reduced by means of a decoupling layer arranged between the piezoelectric thin film and the carrier.

The decoupling properties can be achieved with a material having a low density and a low Young's modulus. Preferably the decoupling layer comprises a material having a Young's modulus of less than 1 GPa and a density of less than 500 $kg/m^3$.

A material that can be produced with such properties is an aerogel.

An aerogel is a synthetic porous ultralight material derived from a gel, in which the liquid component for the gel has been replaced with a gas. The result is a solid with extremely low density and low thermal conductivity. A nicknames includes solid air as aerogel layer shows properties similar like an air gap. Aerogels can be made from a variety of chemical compounds. Aerogel structure results from a sol-gel polymerization, which is when monomers (simple molecules) react with other monomers to form a sol or a substance that consists of bonded, cross-linked macromolecules with deposits of liquid solution between them. When the material is critically heated the liquid is evaporated out and the bonded, cross-linked macromolecule frame is left behind.

Aerogels may be based on metal oxides like e.g. alumina, chromia and tin dioxide. Carbon aerogels are also known.

For the present application silica aerogel is preferred. It is the most common type of aerogel. But other aerogels may be used for the decoupling layer as well.

Silica aerogel can be manufactured with a porosity of 80 to 99.8%. Hence they possess a respective density of 0.16 to 500 $Kg/m^3$. Such a low density material perfectly hinders acoustic waves from passing a respective decoupling layer. Therefore, the wave energy cannot be transferred to any layer below this decoupling layer, which results in a confinement of the acoustic energy of the longitudinal wave within the piezoelectric thin film. As a result the quality factor of the new device is improved.

The device has an outstanding high Q factor and produces low losses even at high frequencies for longitudinal waves.

In a preferred embodiment the device operating with acoustic waves is a SAW resonator. The interdigital transducer of the SAW resonator has electrode fingers arranged with a pitch that is a distance between the geometrical middles of two adjacent electrode fingers. Due to the longitudinal wave type having an outstanding high velocity interdigital transducers may be still produced with conventional geometries and common technique even for waves with a pitch-dependent resonance frequency in an ultra-high frequency regime ranging up to 6 GHz. The SAW device may be used for manufacturing filter devices that can be used for mobile communication in a sophisticated standard like 5G for example.

According to further embodiments optional functional dielectric thin films can be added between carrier substrate and piezoelectric thin film in order to improve certain filter properties like TCF or suppression of volume waves.

The device may comprise a TCF compensating layer arranged between decoupling layer and piezoelectric layer. The TCF compensating layer comprises one of $SiO_2$, doped $SiO_2$ and $GeO_2$.

A shielding layer may be arranged between carrier and decoupling layer. This layer is for avoiding an undesired electric field effect that otherwise occurs at the interface of a Si substrate or carrier and a $SiO_2$ layer deposited directly above. Materials that can be used for the shielding layer may be chosen from poly Si, $Si_3N_4$, AlN, $Al_2O_3$, SiC, diamond like carbon and diamond. Further, these materials have a relative high sound velocity making them useful for wave confinement purposes.

For providing a confinement of the wave energy the carrier substrate may be chosen from e.g. Si, sapphire, SiC, graphene and diamond.

In the following the invention will be explained in more detail with respect to embodiment and the accompanied figures. The figures are schematic only and not drawn to scale. The same elements or elements having the same or comparable function are referenced by the same reference symbols.

FIG. 1 shows a schematic cross section through a stacked device according to a first embodiment FIG. 2 shows a schematic cross section through a stacked device according to a second embodiment FIG. 3 shows schematic electrode structures of a SAW resonator

3

Figure 1:
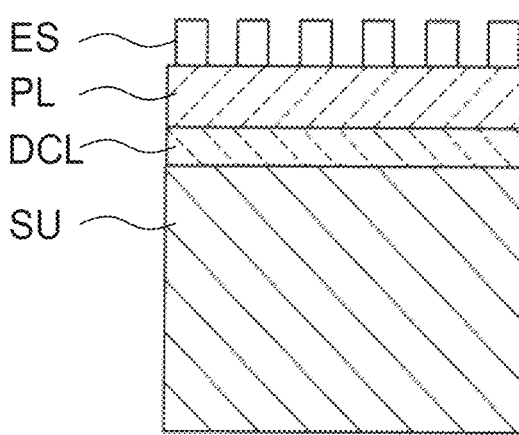

FIG. 1 shows a schematic cross section through a layer stack according to a SAW device of a first embodiment of the invention. The stack is based on a carrier SU. A decoupling layer DCL is arranged above the carrier SU. Thereon a piezoelectric thin film PL is arranged. On top of the stack ab electrode structure realizing e.g. a SAW filter comprising resonators is applied.

Figure 2:
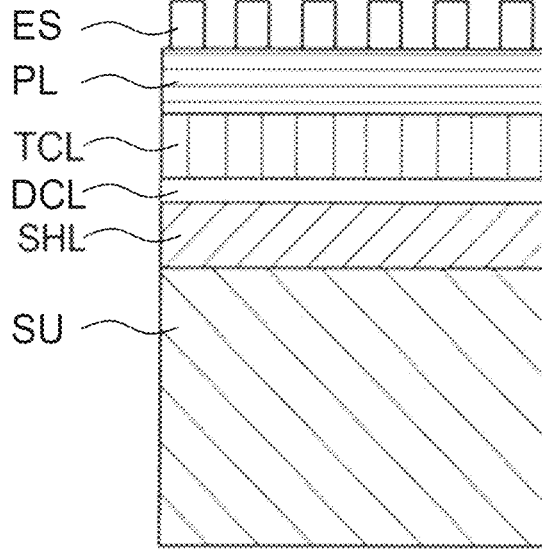

FIG. 2 shows a schematic cross section through a layer stack according to a SAW device of a second embodiment of the invention comprising further optional layers. Compared to the stack of FIG. 1 two additional layers are introduced. A shielding layer of e.g. poly silicon is arranged between carrier SU and decoupling layer DCL. The decoupling layer DCL may comprise an aerogel. Shielding layer may have a thickness of 0.2 µm to 2.5 µm.

Further, a TCF compensating layer TCL of about 100 nm to 800 nm $SiO_2$ is arranged between the decoupling layer DCL and the piezoelectric thin film PL. Thin film PL consists of LN for example that is applied with a cut angle that supports longitudinal wave excitation and propagation.

The electrode structures ES consist of an Al based metallization and comprise interdigital transducers. The pitch of the interdigital transducers is set to a value according the desired wavelength and amounts to a half wavelength of the longitudinal wave propagating in the piezoelectric thin film PL. In a later process step of device manufacture a passivation layer of a dielectric or a resist may be applied (not shown in the figure).

A concrete embodiment comprises from bottom to top the following layers:
  a Si carrier SU,
  a shielding layer of 500 nm of poly-Si
  a decoupling layer DCL of about 25 nm to 75 nm silica aerogel
  a piezoelectric thin film PL of LN170Yrot90X or LN20 having a thickness of 100 nm to 500 nm
  an Al based electrode structure ES that may comprise Cu with a height of about 70 nm to 150 nm.

Figure 3:
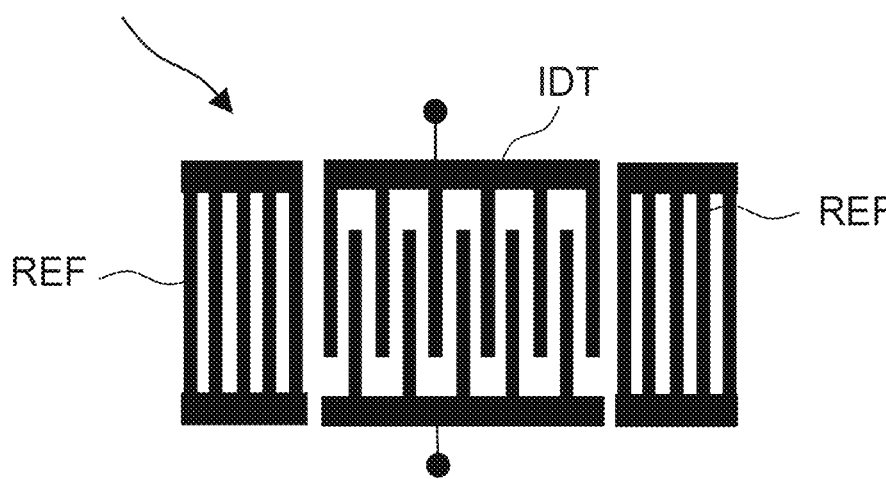

A schematic electrode structure ES of a SAW resonator R is shown in FIG. 3. The resonator R has a commonly known metallization structure consisting of an interdigital transducer IDT arranged in an acoustic track between two reflectors REF.

Figure 4:
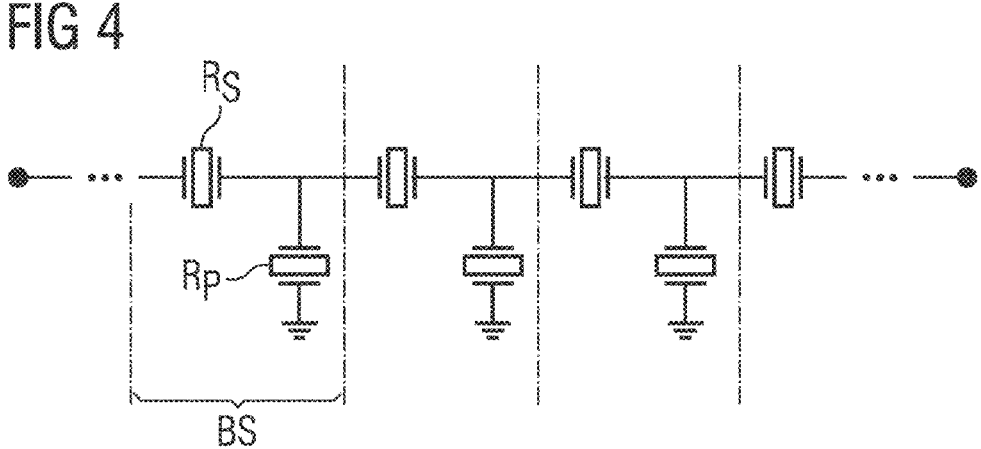
FIG. 4 shows a schematic block diagram of a filter built out of resonators as shown in FIG. 3

FIG. 4 shows a schematic block diagram of a ladder type filter that may be built from the new resonators. The filter comprises at least series resonator RS in a series signal line and a parallel resonator RP arranged in a shunt line extending from the series signal line to ground. A pair of these two resonators forms a basic section BS that already has a filter function. Real ladder type filters comprises n such basic sections BS wherein the number n of which is dependent on the desired degree of achievable filter selectivity. In the figure three basic section and a further series resonator RS are shown exemplarily.

Figure 5:
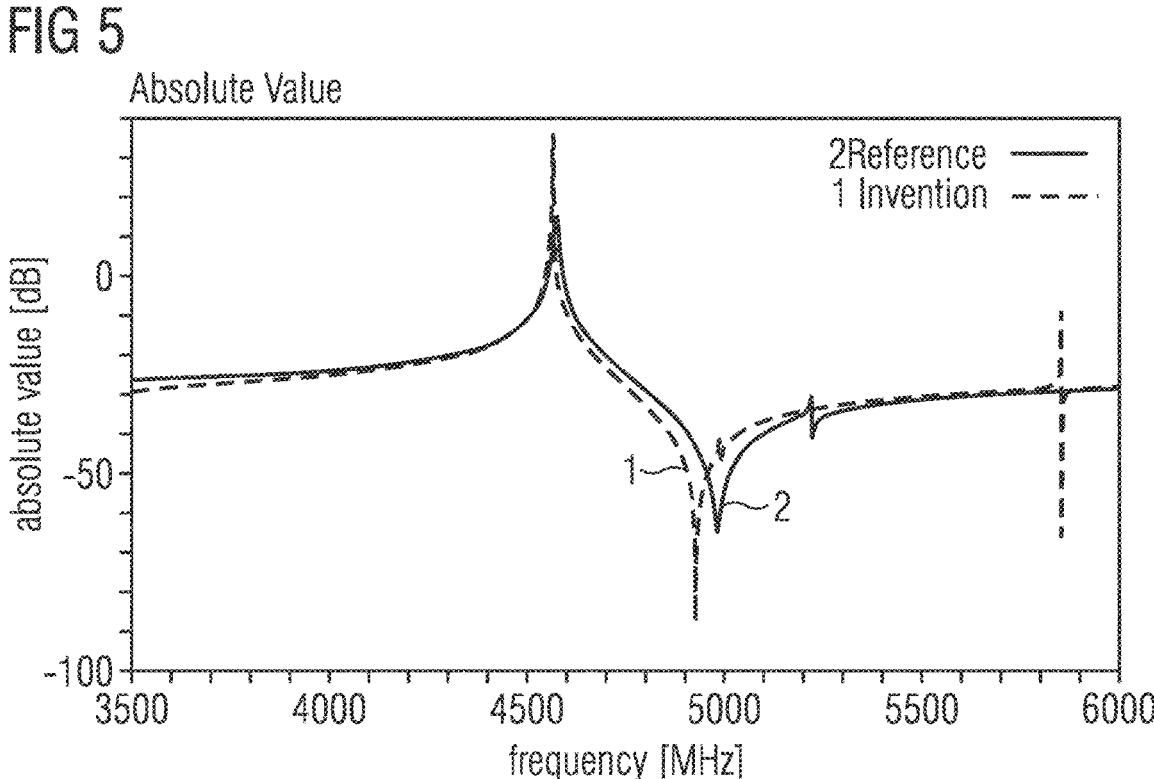
FIG. 5 shows the admittance of a resonator according to an embodiment and of a reference example

FIG. 5 shows the absolute value of the admittance of a resonator as shown in FIG. 3 and based on a layer stack according to FIG. 3 and designated as curve 1. For reference, a curve 2 shows the admittance of a comparable stack that is missing the decoupling layer DCL. In the embodiment the resonators resonates at about 5 GHz. It has a sufficiently high k2 for high frequency applications but is slightly reduced compared to curve 2. The real part shows the outstanding improvement in loss situation that is achieved by adding a decoupling layer DCL which decouples the acoustic in the piezoelectric thin film PL from the layer stack below. Additional volume waves, e.g. at 5 and 5.8 GHz are visible, which can be suppress by further optimizing the layer stack. Coupling factor k2 can be further optimized by thickness and cut angle optimization.

Besides the improved resonance peaks of curve 2 a spurious mode that appears at about 5200 MHz in curve 2 has nearly disappeared and is shifted to a lower frequency of about 5000 MHz as can be seen from curve 1.

Figure 6:
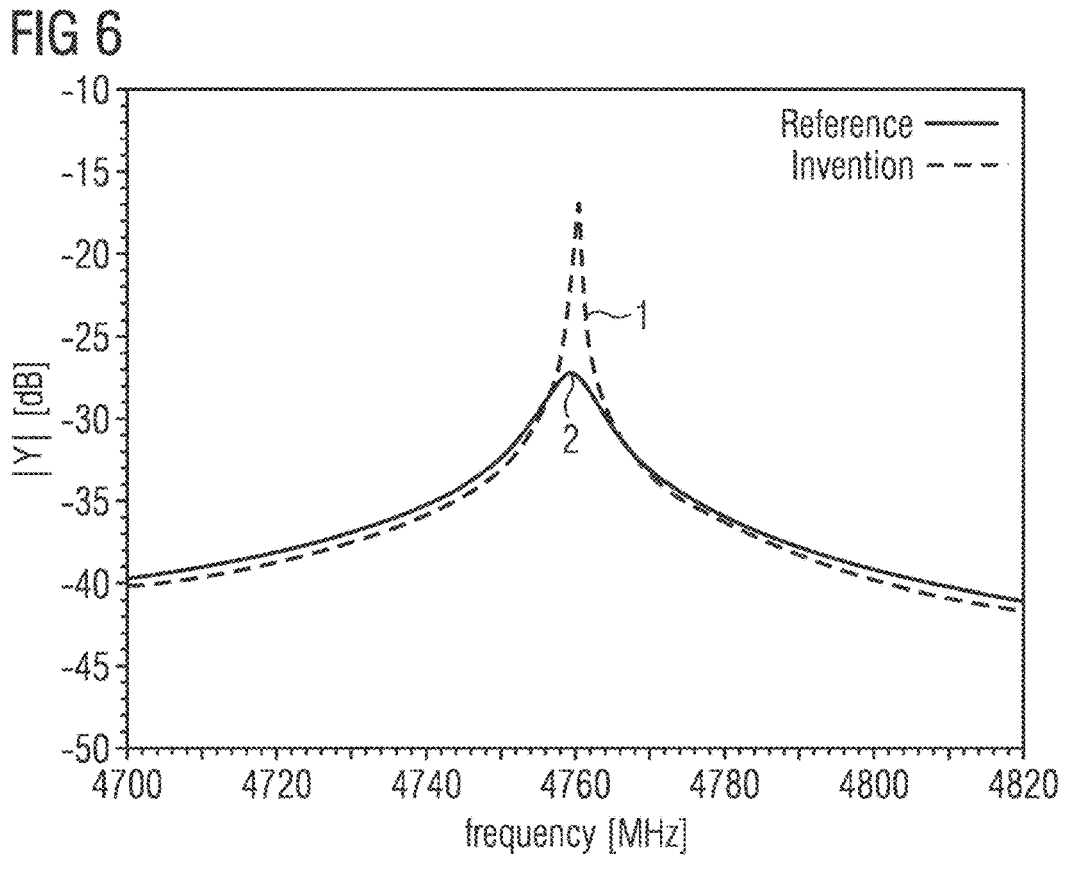
FIG. 6 shows the absolute value of the admittance of a resonator around the resonance frequency according to an embodiment and of a reference example
Figure 7:
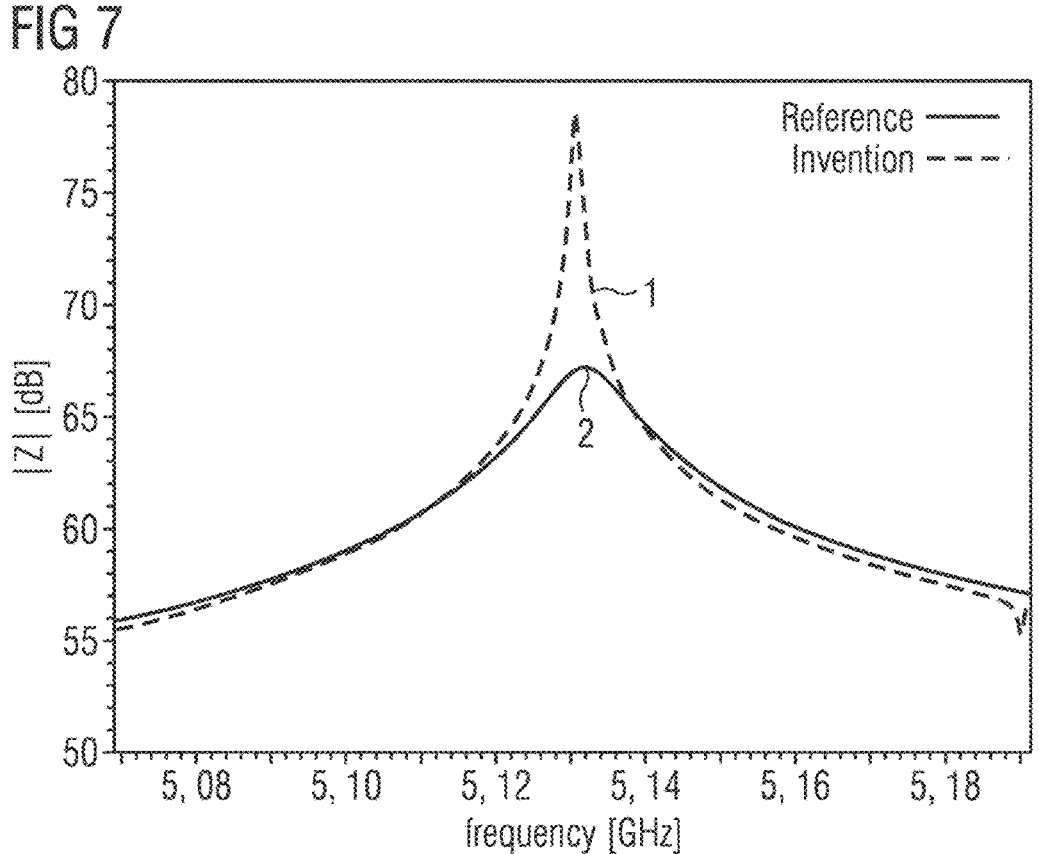
FIG. 7 shows the absolute value of the impedance of a resonator around the resonance frequency according to an embodiment and of a reference example.

FIG. 6 shows the improvement in loss level at resonance and FIG. 7 at anti-resonance frequency of a one-port resonator based on a layer stack according to FIG. 2. Similar like in FIG. 5 curve 1 accords to the invention while curve 2 accords to a respective reference example. The resonance frequency was plotted as absolute value of admittance |Y| and the anti-resonance peak as absolute value of impedance |Z|. In both figures the curves are scaled to the same frequencies for better comparison. It can be seen that the quality factor Q is clearly improved due to sharper and higher peaks.

LIST OF USED TERMS AND REFERENCE SYMBOLS

1,2 Curves assigned to new resonator and reference
BS Basic section of a ladder type filter
DCL Decoupling layer
ES Electrode structure
IDT Interdigital transducer
PL Piezoelectric thin film
REF Reflector
RP,RS,R Resonator
SHL Dielectric layer/shielding layer
SU Carrier
TCL TCF compensating layer

The invention claimed is:

1. A device operating with acoustic waves realized in a layer stack, comprising:
  a carrier;
  a decoupling layer;
  a piezoelectric layer, wherein a material of the piezoelectric layer has a cut-angle selected to support excitement and propagation of acoustic longitudinal waves; and
  an electrode structure for exciting the acoustic longitudinal waves,
  wherein the decoupling layer comprises an aerogel material that acoustically decouples layers above the decoupling layer from layers below the decoupling layer to prevent bulk waves from acoustically coupling to the carrier.

2. The device of claim 1, wherein the decoupling layer has a Young's modulus of less than 1 GPa and a density of less than 500 $kg/m^3$.

3. The device of claim 1, wherein the aerogel material comprises silica aerogel.

4. The device of claim 1, wherein the device is a SAW device comprising an interdigital transducer as the electrode structure.

5

6

5. The device of claim 1, comprising a TCF compensating layer arranged between the decoupling layer and the piezoelectric layer.

6. The device of claim 5, wherein the TCF compensating layer comprises one of $SiO_2$, doped $SiO_2$ and $GeO_2$.

7. The device of claim 1, comprising a shielding layer arranged between the carrier and the decoupling layer.

8. The device of claim 7, wherein the shielding layer comprises one of poly-silicon, $Si_3N_4$, AlN, $Al_2O_3$, SiC, diamond like carbon and diamond.

9. The device of claim 1, wherein the device is realized as a SAW resonator;

wherein the SAW resonator comprises an interdigital transducer as the electrode structure; and wherein pitch of interdigital transducer is set to correspond to a longitudinal wave and a resonance frequency between 2.5 GHz and 6 GHz.

\* \* \* \* \*